(12) United States Patent
Nobunaga et al.

(10) Patent No.: US 8,593,889 B2
(45) Date of Patent: *Nov. 26, 2013

(54) ASYNCHRONOUS/SYNCHRONOUS INTERFACE

(75) Inventors: Dean K. Nobunaga, Cupertino, CA (US); June Lee, San Jose, CA (US); Chih Liang Chen, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 2824 days.

This patent is subject to a terminal disclaimer.

(21) Appl. No.: 13/590,849

(22) Filed: Aug. 21, 2012

(65) Prior Publication Data

US 2012/0314517 A1    Dec. 13, 2012

Related U.S. Application Data

(62) Division of application No. 13/078,563, filed on Apr. 1, 2011, now Pat. No. 8,248,868, which is a division of application No. 12/131,152, filed on Jun. 2, 2008, now Pat. No. 7,920,431.

(51) Int. Cl.
    *G11C 7/00*    (2006.01)

(52) U.S. Cl.
    USPC ............ 365/189.14; 365/189.03; 365/189.16; 365/189.15; 365/189.17; 365/189.18; 365/189.19; 365/230.03; 365/230.05; 365/233.1; 365/233.16; 365/233.17; 365/233.18; 365/233.19

(58) Field of Classification Search
    USPC ............ 365/189.03, 189.14, 189.16, 189.15, 365/189.17, 189.18, 189.19, 230.03, 365/230.05, 233.1, 233.16, 233.17, 233.18, 365/233.19

See application file for complete search history.

(56) References Cited

U.S. PATENT DOCUMENTS

| | | | |
|---|---|---|---|
| 4,721,868 A | | 1/1988 | Cornell et al. |
| 4,761,763 A | * | 8/1988 | Hicks ........................... 710/106 |
| 5,054,020 A | | 10/1991 | Meagher |
| 6,675,329 B1 | | 1/2004 | Im |
| 6,718,311 B1 | * | 4/2004 | Suo-Anttila ................... 705/28 |

(Continued)

OTHER PUBLICATIONS

Micron Technology, Inc., Technical Note 29-19: NAND Flash 101: An Introduction to NAND Flash and How to Design It in to Your Next Product, Nov. 2006.

(Continued)

*Primary Examiner* — Fernando Hidalgo
(74) *Attorney, Agent, or Firm* — Brooks, Cameron & Huebsch PLLC

(57) ABSTRACT

The present disclosure includes methods, and circuits, for operating a memory device. One method embodiment for operating a memory device includes controlling data transfer through a memory interface in an asynchronous mode by writing data to the memory device at least partially in response to a write enable signal on a first interface contact, and reading data from the memory device at least partially in response to a read enable signal on a second interface contact. The method further includes controlling data transfer in a synchronous mode by transferring data at least partially in response to a clock signal on the first interface contact, and providing a bidirectional data strobe signal on an interface contact not utilized in the asynchronous mode.

19 Claims, 11 Drawing Sheets

(56) References Cited

U.S. PATENT DOCUMENTS

| | | | |
|---|---|---|---|
| 6,920,524 B2 | 7/2005 | Lovett | |
| 7,213,121 B2 | 5/2007 | Barth et al. | |
| 7,320,049 B2 | 1/2008 | Lovett | |
| 7,453,738 B2 | 11/2008 | Tarushi et al. | |
| 7,640,413 B2 * | 12/2009 | Lovett | 711/167 |
| 7,760,981 B2 * | 7/2010 | Hodono | 385/132 |
| 2004/0153602 A1 | 8/2004 | Lovett | |
| 2009/0259873 A1 * | 10/2009 | Oh | 713/401 |
| 2010/0149889 A1 | 6/2010 | Koshizuka | |
| 2012/0320693 A1 * | 12/2012 | Kim | 365/191 |

OTHER PUBLICATIONS

Micron Technology, Inc., Technical Note 47-11: DDR2 Differential DQS Feature, Dec. 2004.

Micron Technology, Inc., Technical Note 47-16: Designing for High-Density DDR2 Memory, May 2005.

Micron Technology, Inc., Technical Note 48-03: High Performance with SDRAM Modules, Revised Feb. 1999.

Micron Technology, Inc., Technical Note 48-15: Backward Compatibility for Faster SDRAM, Revised Oct. 2005.

Micron Technology, Inc., Technical Note 49-03: RLDRAM II Clocking Strategies, May 2007.

* cited by examiner

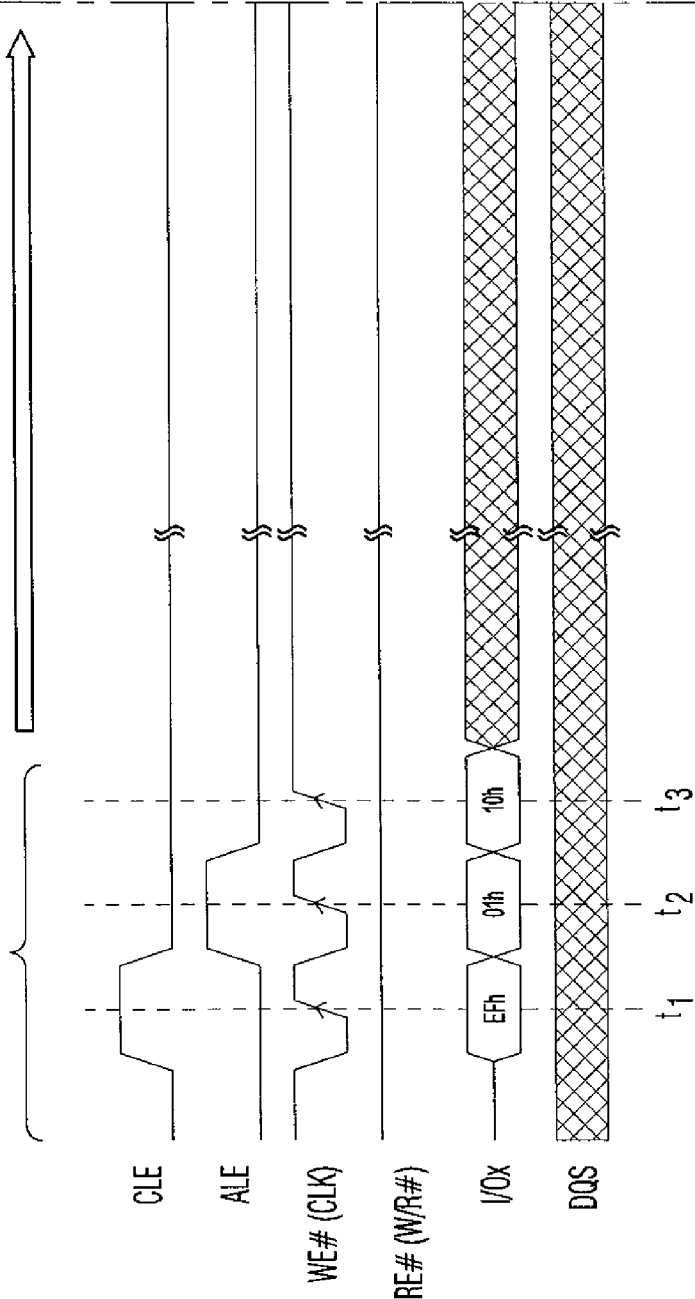

ASYNCHRONOUS/SYNCHRONOUS INTERFACE

PRIORITY APPLICATION INFORMATION

This Application is a Divisional of U.S. application Ser. No. 13/078,563, entitled "Asynchronous/Synchronous Interface," filed Apr. 1, 2011, to be issued on Aug. 21, 2012 as U.S. Pat. No. 8,248,868, which is a Divisional of U.S. application Ser. No. 12/131,152, entitled "Asynchronous/Synchronous Interface," filed Jun. 2, 2008, now U.S. Pat. No. 7,920,431, the specifications of which are incorporated herein by reference.

TECHNICAL FIELD

The invention relates to semiconductors and semiconductor memory devices. More particularly, in one or more embodiments the invention relates to a communication interface for a memory device.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones, among others. Program code and system data, such as a basic input/output system (BIOS), are typically stored in flash memory devices. This information can be used in personal computer systems, and other electronic devices.

Two common types of flash memory array architectures are the "NAND" and "NOR" architectures, so called for the logical form in which the basic memory cell configuration of each is arranged.

A NAND array architecture arranges its array of floating gate memory cells in a matrix such that the gates of each floating gate memory cell in a "row" of the array are coupled to an access line (which is commonly referred to in the art as a "word line" or "select line"). However each memory cell is not directly coupled to a column data line (which is commonly referred to in the art as a "bit line" or "sense line") by its drain. Instead, the memory cells of the array are coupled together in series, source to drain, between a source line and a column sense line.

Memory cells in a NAND array architecture can be programmed to a desired state. That is, electric charge can be placed on or removed from the floating gate of a memory cell to put the cell into a number of stored states. For example, a single level cell (SLC) can represent two states, e.g., 1 or 0. Flash memory cells can also be programmed to more than two states, such as to a number of states that allows a cell to represent more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one binary digit, e.g., more than one bit. MLCs can have more than two programmed states, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

Flash memory devices can be programmed with various amounts of data at one time. The amount of data programmable at one time can be referred to as a page of data. In some memory devices, one page of data includes data stored on memory cells coupled to a given select line. In other memory devices, data stored on a select line can be divided into more than one page, e.g., into an even page and odd page of data. In some instances, a page of data may include data stored in memory cells on more than one select line. Various amounts of data can also be erased from a flash device at the same time. The amount of data erasable at one time can be referred to as a block of data. A block of data can include a number of data pages. A memory plane can include a number of data blocks on a given die. Some memory devices have multiple planes per die. For example, a die could include a plane of even numbered blocks and a plane of odd numbered blocks.

During a programming operation, data can be loaded into cache registers for each memory plane before being programmed to each plane. For example, a page of data may be loaded into a register, then programmed to a plane, after which another page of data may be loaded into the register. This process can repeat until the programming operation completes. During a sensing operation, data can be loaded from one or more memory planes into cache registers.

Currently, the de facto standard interface for NAND flash memory utilized by major NAND flash memory manufacturers is an asynchronous interface. The asynchronous interface has supported several generations of scaling of the input/output (I/O) data rates. However, the scaling limit of the asynchronous interface is fast approaching, and a memory access device will have difficulty in cleanly capturing data from the memory, e.g., NAND Flash, device at higher access speeds.

BRIEF DESCRIPTION OF THE DRAWINGS

FIG. 6A shows timing waveforms associated with an asynchronous interface before switching to a synchronous interface, in accordance with one or more embodiments of the present disclosure.

DETAILED DESCRIPTION

The present disclosure includes methods, and circuits, for operating a memory device. One method embodiment includes controlling data transfer through a memory interface in an asynchronous mode by writing data to the memory device at least partially in response to a write enable signal on a first interface contact, and reading data from the memory device at least partially in response to a read enable signal on a second interface contact. The method further includes controlling data transfer in an synchronous mode by transferring data at least partially in response to a clock signal on the first interface contact, and providing a bidirectional data strobe signal on an interface contact not utilized in the asynchronous mode.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Asynchronous memory devices, e.g., DRAMs built with an asynchronous RAS/CAS interface have difficulty meeting the high memory bandwidth demands of many current computer systems. As a result, synchronous interface standards have been proposed. These alternative interface standards include synchronous DRAM (SDRAM). In contrast to a asynchronous interface for DRAM, SDRAM systems use a clock to synchronize the communication between the memory access device and the SDRAM. Timing communication with a clock allows data to be placed on the SDRAM output with more precise timing. In addition, the clock signal can be used for internal pipelining. These characteristics of synchronous communication results in higher possible transfer rates.

Figure 1:
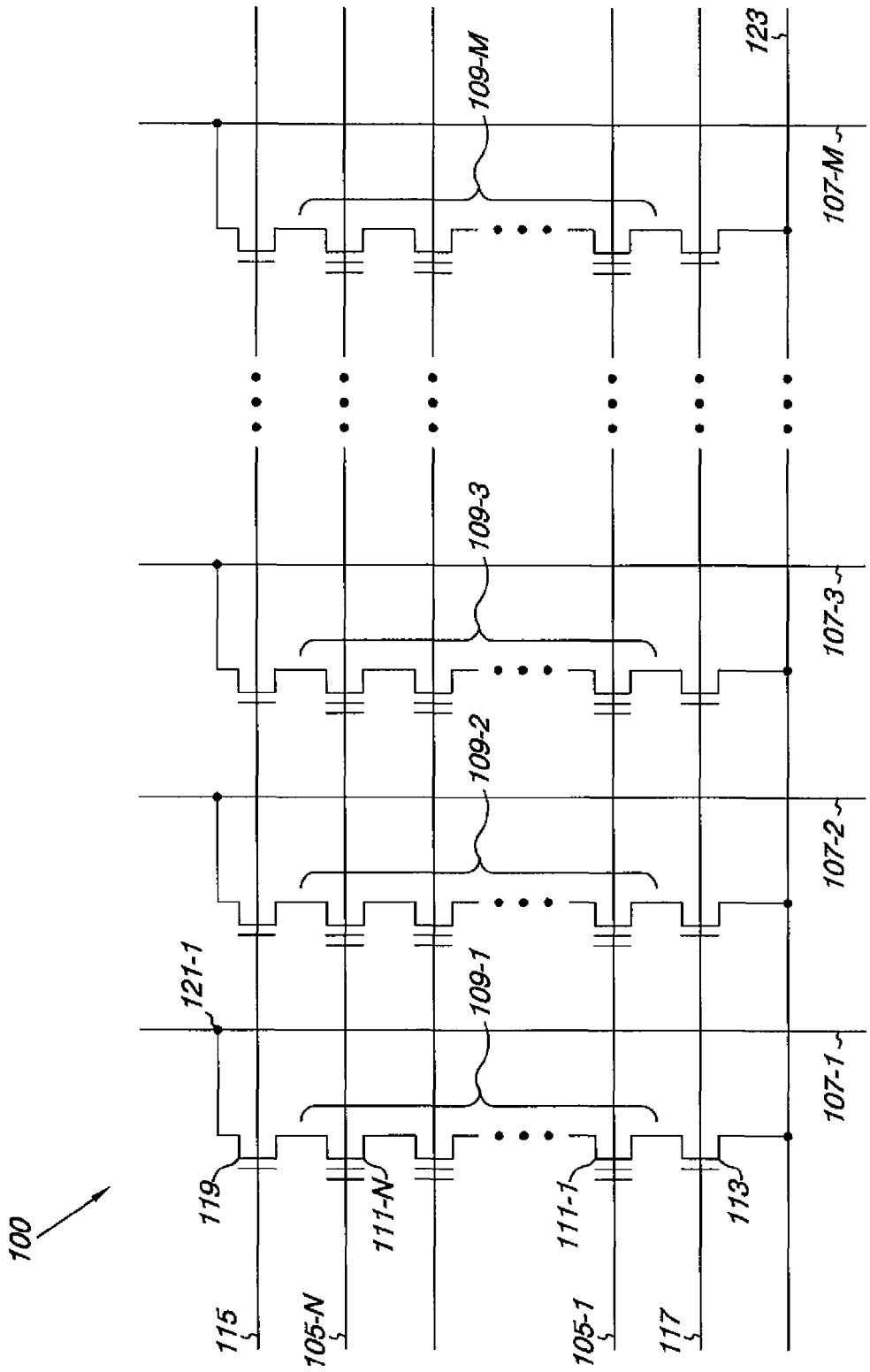
FIG. 1 is a schematic of a portion of a non-volatile memory array, in accordance with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are typically each some power of two, e.g., 256 select lines by 4,096 sense lines.

Memory array 100 includes NAND strings 109-1, . . . , 109-M. Each NAND string includes non-volatile memory cells 111-1, . . . , 111-N, each located at an intersection of a select line, e.g., 105-1, . . . , 105-N, and a local sense line, e.g., 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117. The drain select gate 119 is located at the intersection of the local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of non-volatile memory cells, 111-1, . . . , 111-N, includes a source, a drain, a floating gate or other charge storage node, and a control gate. Non-volatile memory cells, 111-1, . . . , 111-N, have their control gates coupled to a select line, 105-1, . . . , 105-N respectively. A column of the non-volatile memory cells, 111-1, . . . , 111-N, make up the NAND strings, e.g., 109-1, . . . , 109-M, those memory cells being commonly coupled to a given local sense line, e.g., 107-1, . . . , 107-M respectively. A row of the non-volatile memory cells are those memory cells commonly coupled to a given select line, e.g., 105-1, . . . , 105-N. A NOR array architecture would be similarly laid out except that the string of memory cells would be coupled in parallel between the select gates.

As one of ordinary skill in the art will appreciate, subsets of cells coupled to a selected select line, e.g., 105-1, . . . , 105-N, can be programmed and/or sensed together as a group. A programming operation, e.g., a write operation, can include applying a number of program pulses, e.g., 16V-20V, to a selected select line in order to increase the threshold voltage (Vt) of selected cells to a desired program voltage level corresponding to a desired program state.

A sensing operation, such as a read or program verify operation, can include sensing a voltage and/or current change of a sense line coupled to a selected cell in order to determine the state of the selected cell. The sensing operation can involve biasing a sense line, e.g., sense line 107-1, associated with a selected memory cell at a voltage above a bias voltage for a source line, e.g., source line 123, associated with the selected memory cell. A sensing operation could alternatively include precharging the sense line 107-1 followed with discharge when a selected cell begins to conduct, and sensing the discharge.

Sensing the state of a selected cell can include applying a sensing voltage to a selected select line, while biasing the unselected cells of the string at a voltage sufficient to place the unselected cells in a conducting state independent of the threshold voltage of the unselected cells. The sense line corresponding to the selected cell being read and/or verified can be sensed to determine whether or not the selected cell conducts in response to the particular sensing voltage applied to the selected select line. For example, the state of a selected cell can be determined by the select line voltage at which the sense line current reaches a predetermined reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, the interpreted value of data stored in the selected cell can be based on whether the bit line current changes by a predetermined amount or reaches a predetermined level in a given time period.

When the selected cell is in a conductive state, current flows between a source line contact at one end of the string, and a bit line contact at the other end of the string. As such, the current associated with sensing the selected cell is carried through each of the other cells in the string, the diffused regions between cell stacks, and the select transistors.

Figure 2:
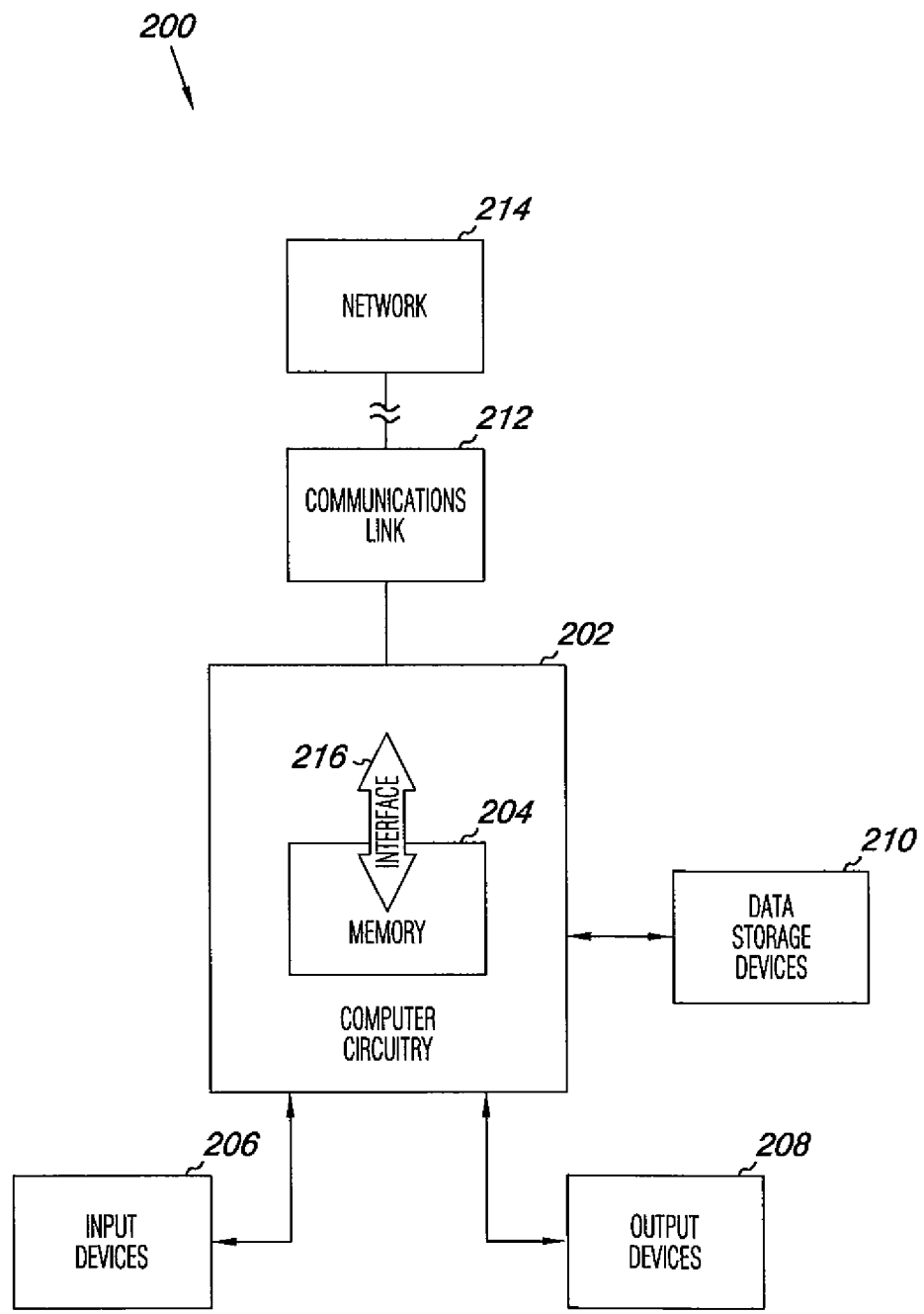
FIG. 2 is a functional block diagram of a computer system having at least one memory device operated in accordance with one or more embodiments of the present disclosure.

FIG. 2 is a functional block diagram of a computer system having at least one memory device operated in accordance with one or more embodiments of the present disclosure. FIG. 2 illustrates a computer system 200 including computer circuitry 202 that contains the memory 204. The computer circuitry 202 performs various computing functions, such as executing specific software to perform specific calculations or tasks. In addition, the computer system 200 may include one or more input devices 206, such as a keyboard and/or pointing device, coupled to the computer circuitry 202 to allow an operator to interface with the computer system 200. Typically, the computer system 200 also includes one or more output devices 208 coupled to the computer circuitry 202, such output devices typically being, for example, a display and/or printing device.

One or more data storage devices 210 are also typically coupled to the computer circuitry 202 to store data or retrieve data. Examples of storage devices 210 include hard disks and non-volatile memory. The computer system 200 may also include a communication link 212 through which the computer circuitry 202 can send and receive data, such as to a network 214. For example, the communication link 212 may be a wireless communication link configured to communicate with the network 214 through a wireless medium. The computer circuitry 202 is typically coupled to the memory 204 through an appropriate interface 216, the interface 216 including address, data, and control busses to provide for writing data to, and reading data from, the memory 204.

Figure 3:
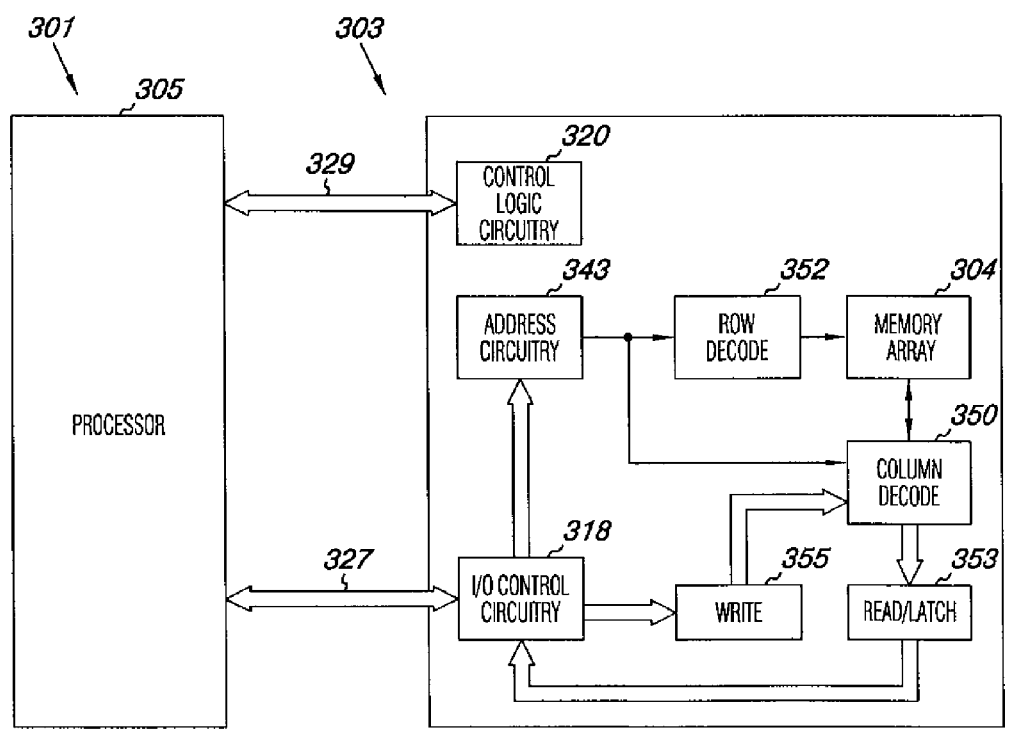
FIG. 3 is a functional block diagram of an electronic memory system having at least one memory device operated in accordance with one or more embodiments of the present disclosure.

FIG. 3 is a functional block diagram of an electronic memory system 301 having at least one memory device 303 operated in accordance with one or more embodiments of the present disclosure. Memory system 301 includes a processor 305 coupled to a non-volatile memory device 303 that includes a memory array 304 of non-volatile memory cells. The memory system 301 can include separate integrated circuits or both the processor 305 and the memory device 303 can be on the same integrated circuit. The processor 305 can be a microprocessor or some other type of controlling circuitry such as an application-specific integrated circuit (ASIC).

The memory device 303 includes an array of non-volatile memory cells 304, which can be floating gate flash memory cells with a NAND architecture, for example. The control gates of memory cells of a "row" are coupled with a select line, while the drain regions of the memory cells of a "column" are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, an AND architecture, or some other memory array architecture.

The embodiment of FIG. 3 includes address circuitry 343 to latch address signals provided over I/O connections 327 through I/O control circuitry 318. Address signals are received and decoded by a row decoder 352 and a column decoder 350 to access the memory array 304. In light of the present disclosure, it will be appreciated by those skilled in the art that the number of address input connections depends on the density and architecture of the memory array 304 and that the number of addresses increases with both increased numbers of memory cells and increased numbers of memory blocks and arrays.

The memory device 303 senses data in the memory array 304 by sensing voltage and/or current changes in the memory array columns using sense/buffer circuitry that in this embodiment can be read/latch circuitry 353. The read/latch circuitry 353 can read and latch a page, e.g., a row, of data from the memory array 304. I/O control circuitry 318 is included for bi-directional data communication over the I/O connections 327 with the processor 305. Write circuitry 355 is included to write data to the memory array 304.

Control logic circuitry 320 decodes signals provided by control connections 329 from the processor 305. These signals can include chip signals, write enable signals, and address latch signals (among others) that are used to control the operations on the memory array 304, including data sensing, data write, and data erase operations. The control logic circuitry 320 can send signals, e.g., commands, to selectively reset particular registers and/or sections of registers according to one or more embodiments of the present disclosure. In one or more embodiments, the control logic circuitry 320 is responsible for executing instructions from the processor 305 to perform the operations according to embodiments of the present disclosure. The control logic circuitry 320 can be a state machine, a sequencer, or some other type of controller. It will be appreciated by those skilled in the art that additional circuitry and control signals can be provided, and that the memory device detail of FIG. 3 has been reduced to facilitate ease of illustration.

Figure 4:
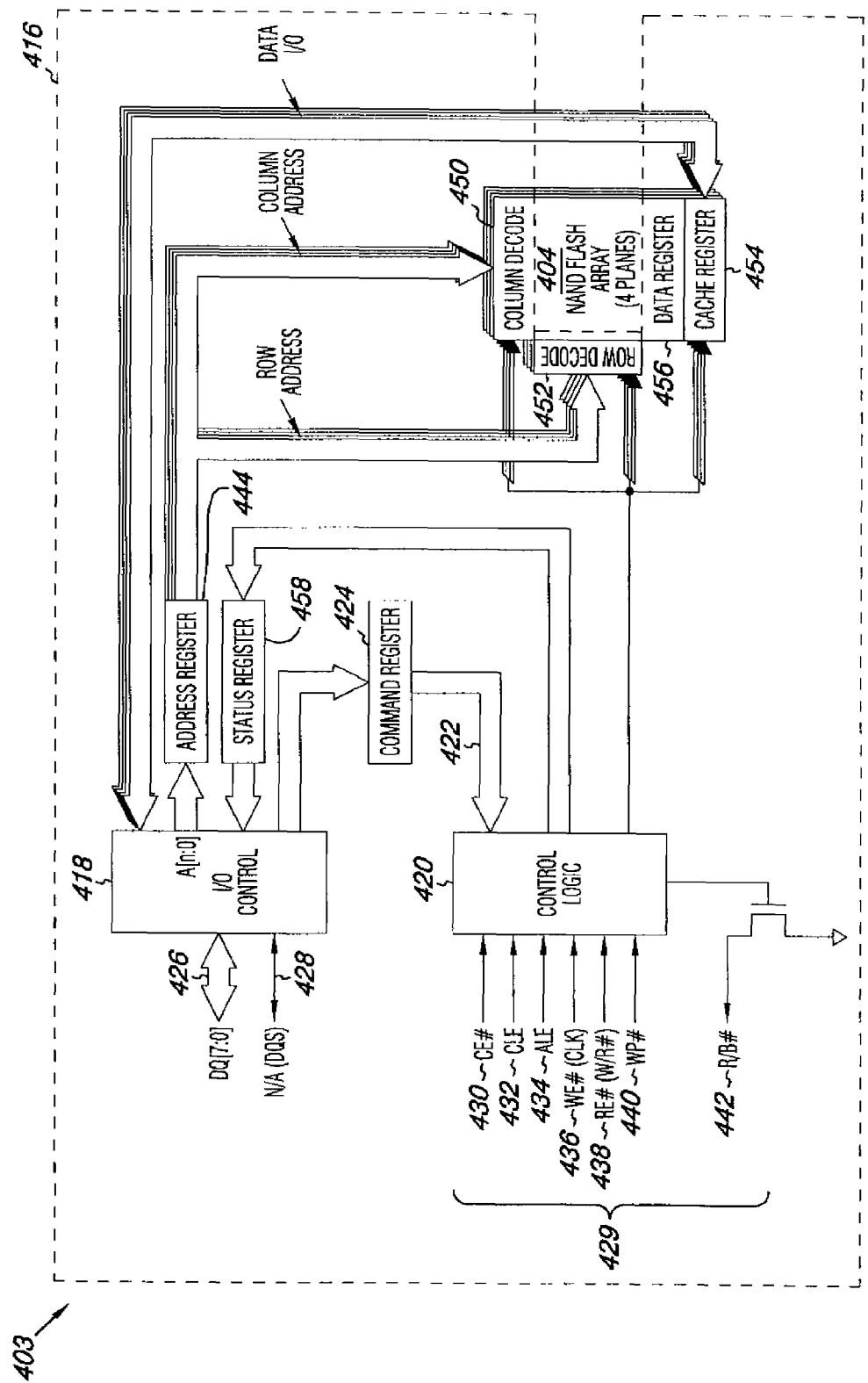
FIG. 4 is a functional block diagram of a memory device, in accordance with one or more embodiments of the present disclosure.

FIG. 4 is a functional block diagram of a memory device in accordance with one or more embodiments of the present disclosure. FIG. 4 illustrates a memory device 403, including a memory interface 416 and memory 404. While memory 404 is shown being a NAND Flash array arranged to have 4 planes, embodiments of the present invention are not so limited, and may include other types of memory, as well different memory arrangements, e.g., more or fewer planes, etc.

According to one or more embodiments of a memory device, e.g., memory device 403, a NAND flash memory device does not include dedicated address contacts, e.g., pins, pads, signal lines, etc. Data, commands, and addresses are all multiplexed onto the same pins, e.g., 426, and received by I/O control circuits 418, providing the memory device with a reduced pin count. Commands are latched by a command register 424 and are transferred to control logic circuits for generating internal signals to control memory device operations.

Addresses are latched by an address register 444 and sent to a row decoder 452 to select a row address, or to a column decoder 450 to select a column address. The data are transferred to or from the NAND flash memory array 404, byte by byte, through a data register 456 and cache register 454. The cache register 454 is closest to I/O control circuits 418, and acts as a data buffer for the I/O data. The data register 456 is closest to the memory array 404, and acts as a data buffer for the memory array 404.

The memory interface 416 includes an I/O control 418 and control logic 420. Control logic 420 receives memory commands, e.g., through signal lines and/or a command bus. For example, control logic 420 receives a SYNC signal 422 which may be a particular status bit, e.g., flag, set in a command register 424.

I/O control 418 generates internal control signals within the memory device 403 to carry out various memory operations. The control signals may be coded digital values, e.g., binary and/or hexadecimal codes, etc. For example, a register bit may be set, or cleared, e.g., as a flag, to indicate status of a control signal, or a hexadecimal code may be communicated over an I/O path to indicate a particular command of an instruction set.

Row and column addresses are provided by the address register, e.g., buffer, 444 for decoding by a row address decoder 452 and a column address decoder 450, respectively. Memory array I/O circuitry 418 is coupled to the memory array, e.g., 404, via an I/O data bus. Write data are applied to the memory array 404 through a data input buffer, e.g., cache register 454, and the memory array read/write circuitry, e.g., data register 456.

The control logic 420 responds to memory commands applied through the command register 424 to perform various operations on the memory array 404. In particular, the command register 424 is used to generate internal control signals to read data from and write data to the memory array 404. The data read from the memory array 404 are transferred to the output buffer, e.g., data register 456, and provided on the data I/O lines. In a write operation, the addressed memory cell is accessed and data provided on the data I/O lines to the data input buffer, e.g., data register 456 (through the cache register 454), to be stored in the memory array 404.

According to one or more embodiments of the present disclosure, memory 404 is a high speed NAND Flash device, and memory interface 416 can be operated in a synchronous mode for high-performance I/O operations, or in an asynchronous mode for legacy NAND Flash operations. Memory interface 416 uses a highly multiplexed 8-bit bus 426 (DQ[7:0]) to transfer commands, addresses, and data. Data transfers in the synchronous mode include a bidirectional data strobe (DQS) 428.

According to one or more embodiments, between the synchronous and asynchronous modes, a number signals are used to implement a NAND Flash protocol. In the asynchronous mode, these signals include a chip enable (CE#) signal on a CE# signal line 430, command latch enable (CLE) signal on a CLE signal line 432, address latch enable (ALE) signal on a ALE signal line 434, write enable (WE#) signal on a WE# signal line 436, and read enable (RE#) signal on a RE# signal line 438. Additional signals control hardware write protection, e.g., the write protection (WP#) signal on the WP# signal line 440, and monitor device status, e.g., the ready/busy (R/B#) signal on the R/B# signal line 442. As one skilled in the art will appreciate, the "#" symbol indicates a particular signal being active in a LOW logic state.

The CE# signal enables or disables one or more logical units, e.g., an 8 Gb block of memory 404, when memory interface 416 is operating in asynchronous mode. The CLE signal is used to load a command from the bus 426 (DQ[7:0]) into the command register 424. The ALE signal is used to load an address from the bus 426 (DQ[7:0]) into an address register 444. The WE# signal transfers commands, addresses, and serial data from a memory access device (e.g., processor, memory controller, control circuitry, host system, computer circuitry 202 shown in FIG. 2, etc.) to the memory 404 when memory interface 416 is operating in asynchronous mode. The RE# signal transfers serial data from the memory 404 to the host system, e.g., computer circuitry 202 shown in FIG. 2, when memory interface 416 is operating in asynchronous mode. The WP# signal enables or disables memory 404 programming and erase operations when memory interface 416 is operating in asynchronous mode. The R/B# signal is an open-drain, active low output that requires an external pull-up resistor.

When memory interface 416 is operating in synchronous mode, signals to/from memory interface 416 include the CE# signal on the CE# signal line 430, the CLE signal on the CLE signal line 432, the ALE signal on the ALE signal line 434, a clock (CLK) signal on the WE# signal line 436, write/read (W/R#) signal on the RE# signal line 438, and the DQS signal on the DQS signal line 428. The CLK signal latches command and address states when memory interface 416 is operating in synchronous mode. The W/R# signal controls the direction of the bus 426 (DQ[7:0]).

Address information from address register 444 is directed to a column decode 450 and/or a row decode 452, which in turn, drives selection of one or more memory cells of memory 404. Data I/O information is written to/read from memory 404 through a cache register 454 and data register 456. Control logic 420 loads status information into a status register 458, which may be further communicated to I/O control 418.

Figure 5:
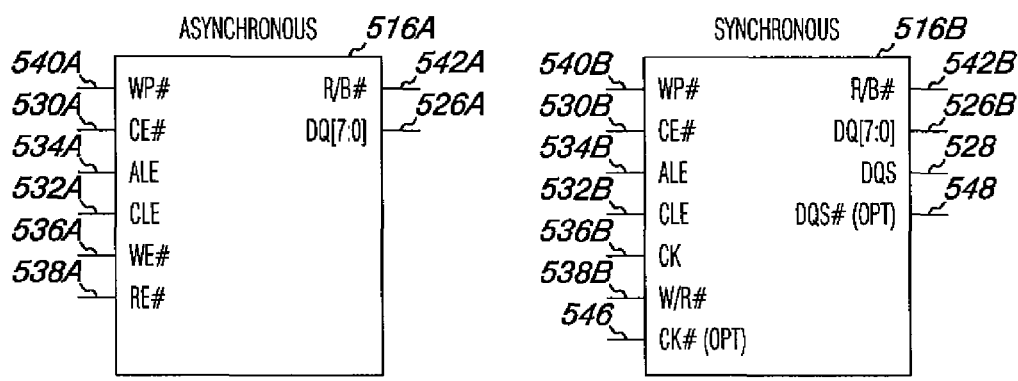
FIG. 5 shows I/O pin assignments of a memory interface for asynchronous, and synchronous, operating modes respectively, in accordance with one or more embodiments of the present disclosure.

FIG. 5 shows I/O pin assignments for a memory interface operating in asynchronous, and synchronous, modes respectively, in accordance with one or more embodiments of the present disclosure. The two memory interface modes support, for example, a legacy NAND memory in asynchronous mode and higher speed NAND in synchronous mode.

As one skilled in the art will appreciate, by redefining the signals on two existing pins, and enabling one new I/O pin for use in the synchronous mode, the memory interface of the present disclosure results in a low-pin-count device with a backwards compatible pin-out arrangement from one memory density to another. This backwards compatible pin-out arrangement, operable for both asynchronous and synchronous modes, also allows for future upgrades from a lower density memory to higher density memory arrangements without significant redesign.

The pin assignments for one or more embodiments of a memory interface 516A in the asynchronous mode includes control pins WP# 540A, CE# 530A, ALE 534A, CLE 532A, WE# 536A, and RE# 538A, an output pin R/B# 542A, and the I/O pins of the bus 526A (DQ[7:0]). The pin assignments for one or more embodiments of a memory interface 516B in the synchronous mode include redefining the signals on the WE# 536A and RE# 538A pins as CLK (clock input) and W/R# signals respectively, and the I/O pin DQS is enabled. In synchronous mode, the signal on the W/R# pin 538B controls the bus 526B direction for DQ, e.g., DQ[7:0], and DQS. The signal on the DQS pin 528 is a data strobe, and is driven from the source of the data. Thus, for read operations from memory, the memory device drives the DQS signal with the output data, e.g., DQ, and the bidirectional DQS signal is edge aligned with the data. For write operations to the memory device, the memory access device, e.g., host, drives the DQS signal with the input data, and the DQS signal is center aligned with the data, e.g., with DQ.

As comparatively illustrated in FIG. 5, the WP# signal line 540A of the memory interface 516A in the asynchronous mode corresponds to the WP# signal line 540B of the memory interface 516B in the asynchronous mode. The CE# signal line 530A of the memory interface 516A in the asynchronous mode corresponds to the CE# signal line 530B of the memory interface 516B in the asynchronous mode. The ALE signal line 534A of the memory interface 516A in the asynchronous mode corresponds to the ALE signal line 534B of the memory interface 516B in the asynchronous mode. The CLE signal line 532A of the memory interface 516A in the asynchronous mode corresponds to the CLE signal line 532B of the memory interface 516B in the asynchronous mode. The WE# signal line 536A of the memory interface 516A in the asynchronous mode corresponds to the CK (clock) signal line 536B of the memory interface 516B in the asynchronous mode. The RE# signal line 538A of the memory interface 516A in the asynchronous mode corresponds to the W/R# signal line 538B of the memory interface 516B in the asynchronous mode. The R/B# signal line 542A of the memory interface 516A in the asynchronous mode corresponds to the R/B# signal line 542B of the memory interface 516B in the asynchronous mode. The bus (DQ [7:0]) signal line 526A of the memory interface 516A in the asynchronous mode corresponds to the bus (DQ [7:0]) signal line 526B of the memory interface 516B in the asynchronous mode.

Memory interface 516B in the synchronous mode also shows the additional DQS signal line 528. To achieve even higher data rates in a synchronous mode, signals on optional pins CK# (complementary clock) signal line 546 and DQS# (complementary DQS) signal line 548 can be implemented. Those skilled in the art will recognize that presence of complimentary timing signals facilitates use of differential input buffers, and thus faster signal state recognition.

FIGS. 6A-6D show timing waveforms for examples of switching a memory interface of the present disclosure between asynchronous and synchronous modes using a Set Feature command set for writing data, and a Get Feature command set for reading data. The Set Feature command set shows how data is written to a memory device in both interface modes, e.g., asynchronous and synchronous. The Get Feature command set shows how data is read from the memory device in both interface modes.

When the memory interface is activated in synchronous mode, high-speed SDR, and optionally DDR, I/O data transfers are capable. Certain signal lines used for asynchronous data transfer are used to communicate different signals for high-speed synchronous data transfer. For example, the WE# signal line is used to communicate a clock to provide a timing reference to the memory device, an additional signal line communicating a bidirectional data strobe signal (DQS) is enabled, and a RE# signal line is used to communicate a W/R# signal. During memory device data output, the DQS signal is driven by the memory device. During memory device data input, the DQS signal is controlled by a memory access device while inputting data on the I/O bus, e.g., DQ[7:0].

The direction of the DQS signal line and I/O bus are controlled by the W/R# signal. The W/R# signal is unasserted, e.g., latched HIGH, when the host memory controller is driving the I/O bus and DQS signal line. The W/R# signal is asserted, e.g., latched LOW, when the memory device is driving the I/O bus and DQS signal line.

Figure 6B:
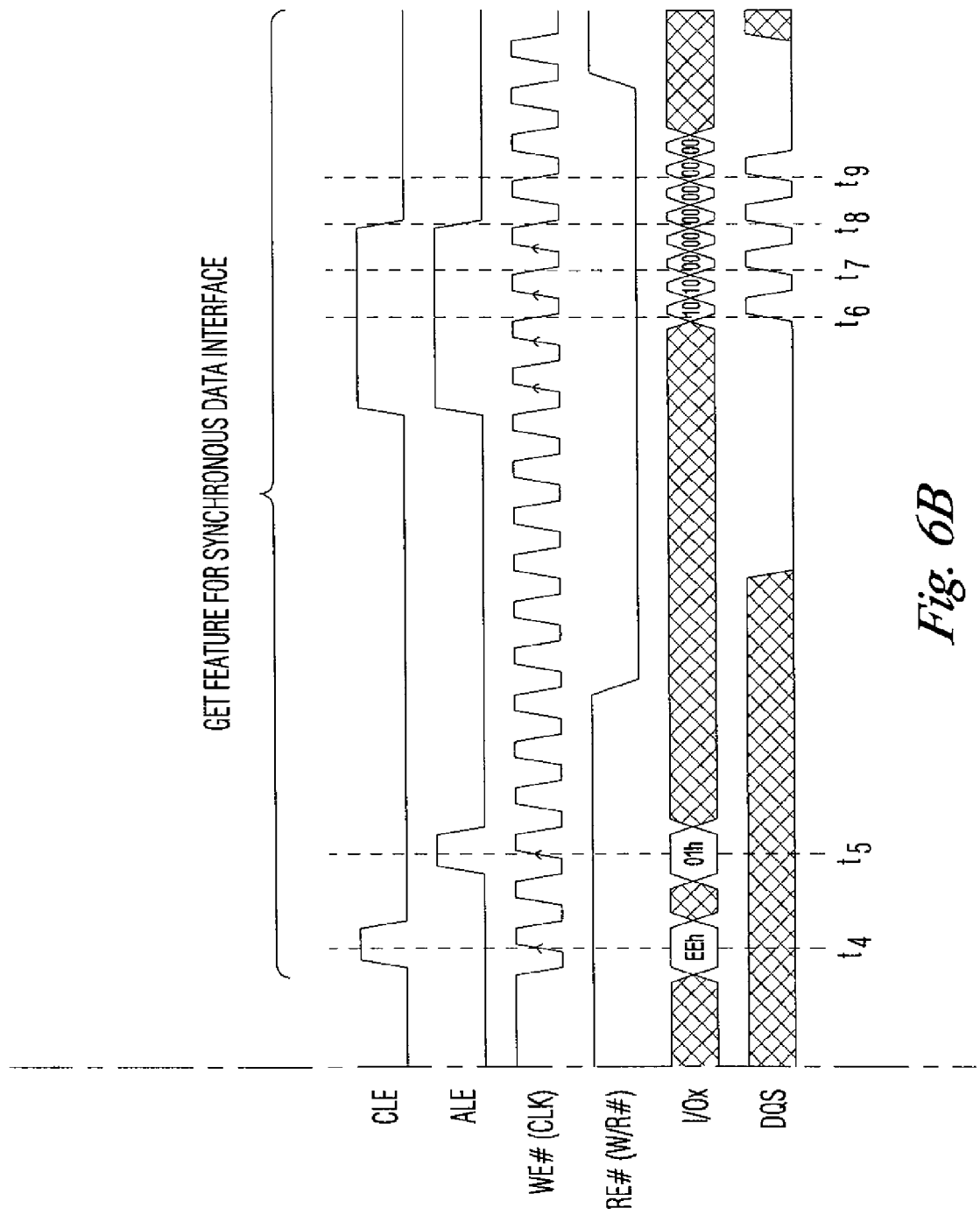
FIG. 6B shows timing waveforms associated with a synchronous interface after switching from an asynchronous interface, in accordance with one or more embodiments of the present disclosure.
Figure 6C:
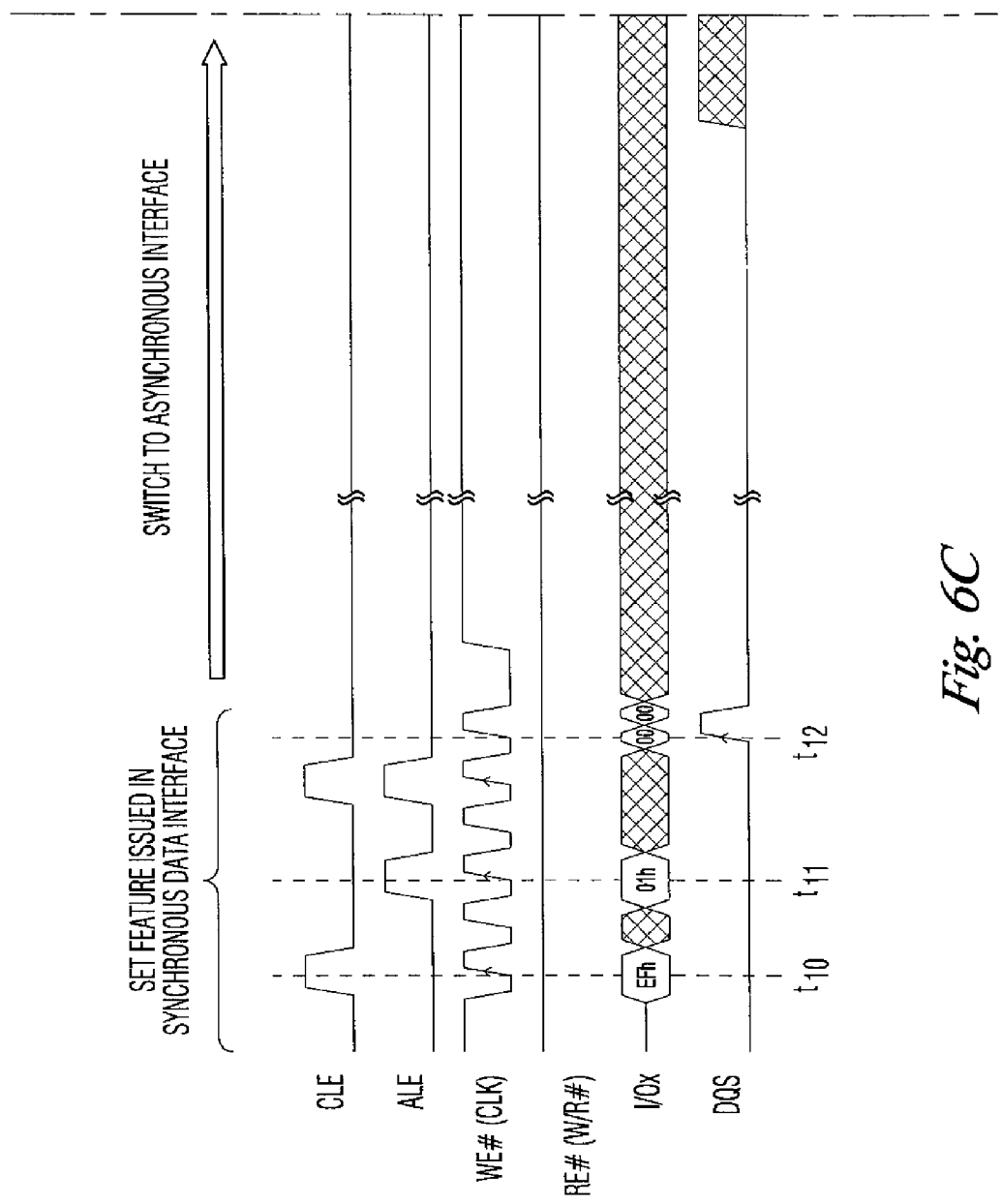
FIG. 6C shows timing waveforms associated with a synchronous interface before switching to an asynchronous interface, in accordance with one or more embodiments of the present disclosure.
Figure 6D:
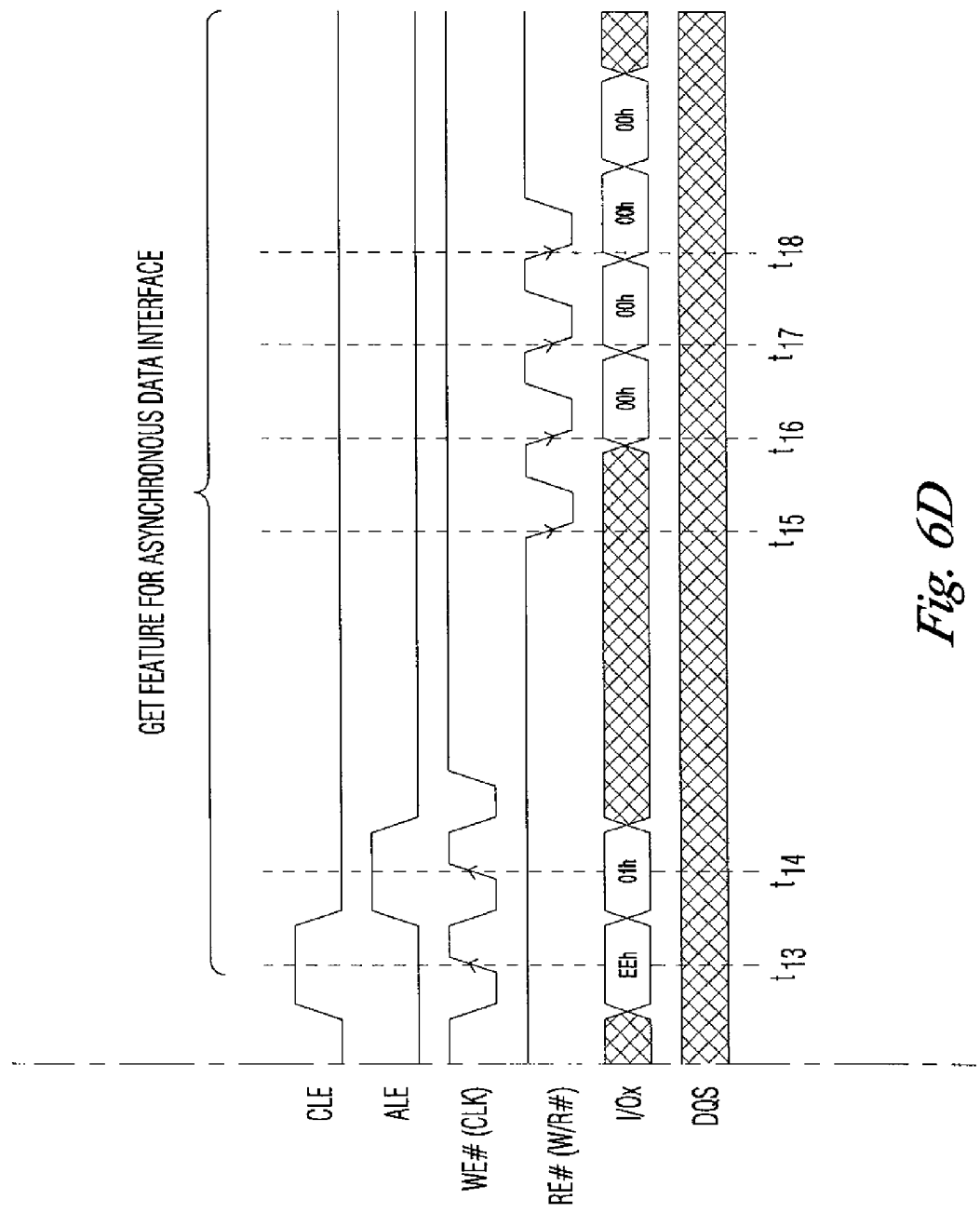
FIG. 6D shows timing waveforms associated with an asynchronous interface after switching from a synchronous interface, in accordance with one or more embodiments of the present disclosure.

FIG. 6A illustrates the timing waveforms for an example of a Set Feature command set, issued to the data, e.g., memory, interface to perform a write operation in an asynchronous mode, thereafter switching to a synchronous mode. FIG. 6B illustrates the timing waveforms of a Get Feature command set issued in the synchronous mode to perform a read operation. FIG. 6C illustrates the timing waveforms for an example of a Set Feature command set issued to the data, e.g., memory, interface to perform a write operation in a synchronous mode, thereafter switching to an asynchronous mode. FIG. 6D illustrates the timing waveforms of a Get Feature command set issued in the asynchronous mode to perform a read operation.

The Set Feature command set consists of communicating, on a multiplexed bus, an initial command, followed by address information, and then by the data. In the asynchronous mode, the command, address information, and data are latched on the rising edge of the WE# signal, as shown in FIG. 6A. In the synchronous mode, the command, address information are latched on the rising edge of the CLK, e.g., clock, signal, and the data is latched center aligned with the DQS, e.g., data strobe, signal, as shown in FIG. 6C.

The Get Feature command set consists of communicating, on the multiplexed bus, an initial command, followed by address information, and then by the read-out data. In the asynchronous mode, the command, address information, and the read data are output on the falling edge of the RE# signal, as shown in FIG. 6D. In the synchronous mode, the command, address information are latched on the rising edge of the CLK, e.g., clock, signal, and the data is output on the rising (and optionally the falling) edges of the CLK (clock) signal, with ALE and CLE signals high and W/R# signal low.

Those having ordinary skill in the art will appreciate that programmable elements, e.g., fuses, metal options, antifuses, and floating gate transistors, can also be used to select either the asynchronous or synchronous mode for the interface on power-up, for example to remain in the selected mode.

FIG. 6A shows timing waveforms associated with a memory interface in asynchronous mode, before switching to a synchronous mode, in accordance with one or more embodiments of the present disclosure. The communication between a memory device and a memory controller is asynchronous. Thus, the memory device is not driven by an external clock. Rather, timing chains that are activated by the control signals, e.g., ALE and CLE, are used to control the timing of the data transfer. The memory controller uses control signals to indicate to the memory device, e.g., an array, when requests for data transactions are sent. The data transfers themselves are also performed asynchronously.

The Set Feature command set is used to write data to the memory device. Time t1 indicates the initial command cycle with the CLE signal being in a HIGH logic state corresponding to a rising edge of the WE# signal, with the Set Feature command, e.g., EFh, being communicated on the bus (e.g., DQ, shown as I/Ox in FIG. 6A). Time t2 indicates the address cycle with the ALE signal being in a HIGH logic state corresponding to a rising edge of the WE# signal with the address, e.g., 01h, on the bus being latched. Time t3 indicates the data cycle with data, e.g., 10h, on the bus, being latched on a rising edge of the WE# signal. The RE#, i.e., read enable, signal is in an unasserted, e.g., HIGH, logic state during the asynchronous write operation.

FIG. 6B shows timing waveforms associated with a memory interface in a synchronous mode, after switching from an asynchronous mode, in accordance with one or more embodiments of the present disclosure. The Get Feature command set is used to read data from the memory device. Time t4 indicates the initial command cycle in the synchronous mode with the CLE signal being in a HIGH logic state corresponding to a rising edge of the CLK (clock) signal (present on the pin corresponding to the WE signal in the asynchronous mode). The Get Feature command, e.g., EEh, communicated on the bus (e.g., I/Ox) is latched during the initial command cycle.

Time t5 indicates the address cycle with the ALE signal being in a HIGH logic state corresponding to a rising edge of the CLK (clock) signal with the address, e.g., 01h, present on the bus, being latched during the address cycle. After some delay, and with CLE and ALE signals again in an asserted, e.g., HIGH, logic state, and the W/R# signal also in an asserted, e.g., LOW, logic state indicating a read operation, time t6 begins the data cycle(s) with data being output and edge aligned with the data strobe (DQS) signal. FIG. 6B shows that the CLE and ALE signals are latched HIGH at four CLK signal rising edges, which corresponds to the four data output cycles as shown at t6 to t9. The above-mentioned delay may be, for example, 1½ clock cycles after the CLE and ALE signals are asserted again, e.g., transition to a HIGH logic state, or may be a predefined access time regardless of clock period. The reader will appreciate that the bus, e.g., I/Ox, and data strobe (DQS) signals are driven by the memory device for a read operation, and thus the delay is an internal delay.

FIG. 6C shows timing waveforms associated with a memory interface in a synchronous mode, before switching to an asynchronous mode, in accordance with one or more embodiments of the present disclosure. The Set Feature command set is used to write data to the memory device. Time t10 indicates the initial command cycle in a synchronous mode with the CLE signal being in a HIGH logic state corresponding to a rising edge of the CLK (clock) signal (present on the pin corresponding to the WE# signal of the asynchronous mode). The Set Feature command, e.g., EFh, communicated on the bus (e.g., I/Ox) is latched during the initial command cycle.

Time t11 signals the address cycle with the ALE signal being in an asserted, e.g., HIGH logic state corresponding to a rising edge of the CLK (clock) signal with the address, e.g., 01h, present on the bus, being latched during the address cycle. After some delay, and with CLE and ALE signals again in an asserted, e.g., HIGH, logic state, and the W/R# in an unasserted, e.g., HIGH, logic state indicating a write operation, time t12 begins the data cycle with data being latched corresponding to a center aligned assertion, e.g., a HIGH logic state, of the data strobe (DQS) signal with the data, e.g., 00h etc., being clocked-in on the bus.

While the waveforms illustrated in FIG. 6B for the GET feature, and in FIG. 6C for the SET feature in the synchronous mode, are shown to be essentially for single data rate (SDR) operations, with the same data (e.g., I/Ox) present on both the rising and falling edges of the DQS signal, embodiments of the present disclosure are not so limited. A dual data rate (DDR) implementation may be supported by one or more embodiments of the asynchronous/synchronous interface disclosed herein, having different data (input or output) on the rising and falling edges of the DQS signal respectively. A DDR interface embodiment may be implemented, for example, with memory array operations in synchronous mode, and utilizing, for example, complementary signals on the optional CK# and DQS# pins, as shown in FIG. 5.

FIG. 6D shows timing waveforms associated with an asynchronous interface after switching from a synchronous interface, in accordance with one or more embodiments of the present disclosure. The Get Feature command set is used to read data from the memory device. Time t13 indicates the initial command cycle with the CLE signal being in a HIGH logic state corresponding to a rising edge of the WE# signal, with the Get Feature command, e.g., EEh, being communicated on the bus (e.g., DQ, shown as I/Ox in FIG. 6D). Time t14 indicates the address cycle with the ALE signal being in a HIGH logic state with the address, e.g., 01h, on the bus being latched corresponding to a rising edge of the WE# signal.

After some delay, time t15 indicates the beginning of the read data cycle(s), with data being latched on a falling edge of the RE# (read enable) signal with data, e.g., 00h, being present on the bus, e.g., I/Ox. The WE# (write enable) signal is in an unasserted, e.g., HIGH logic state, during the asynchronous read operation.

The signals indicated in FIGS. 6A-6D correspond to one method for implementing embodiments of the present disclosure. It will be appreciated by those ordinarily skilled in the art that changes to the particular signals provided to/from the memory interface, as shown in FIG. 6A-6D, will not depart from the scope of the present invention.

Figure 7:
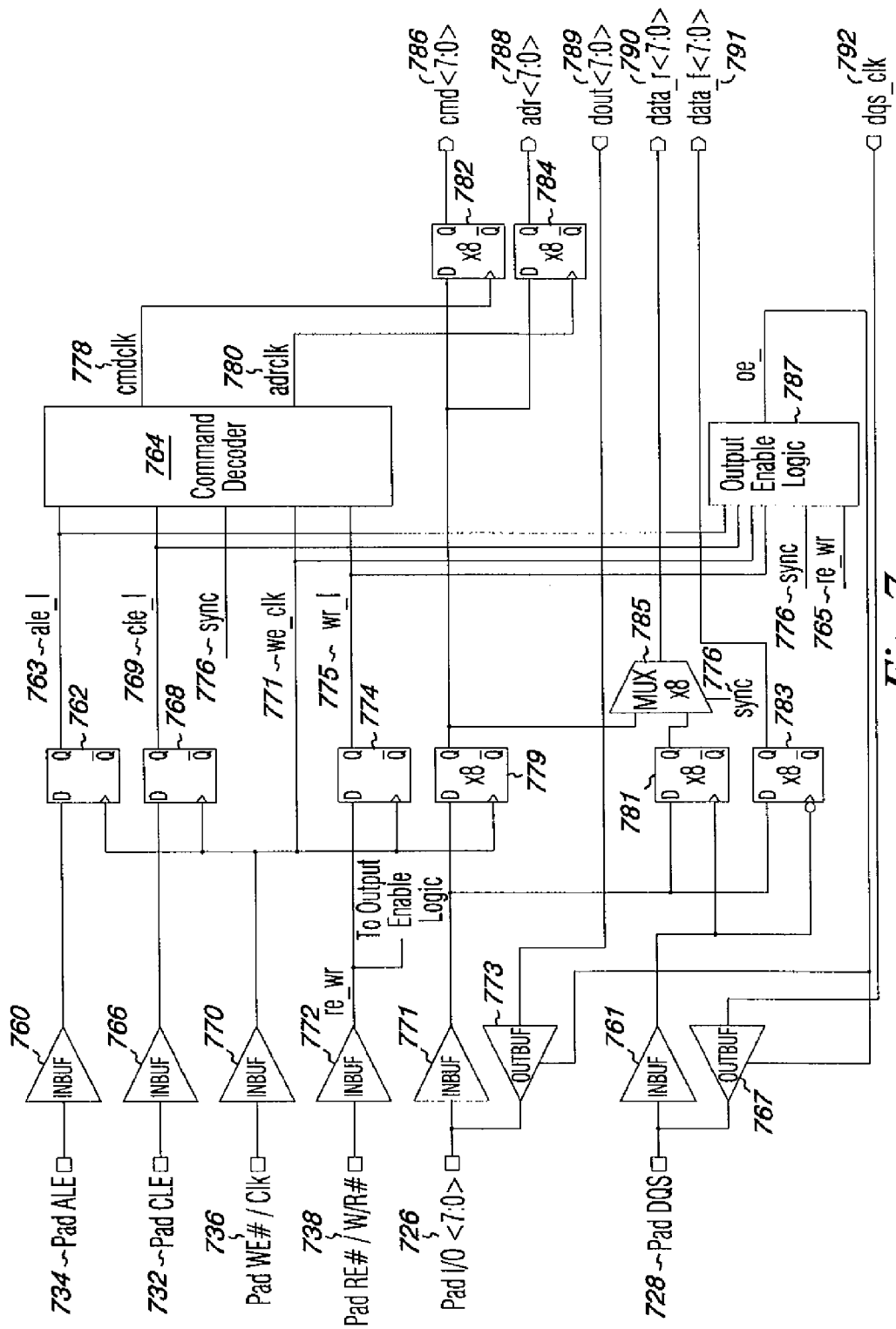
FIG. 7 is a circuit diagram of a memory interface circuit, in accordance with one or more embodiments of the present disclosure.

FIG. 7 is a circuit diagram of a memory interface circuit, in accordance with one or more embodiments of the present disclosure. Logic of the memory interface circuit consists of an input and output buffer portion, an input register portion, a command decoder portion, and an output enable logic portion. According to one or more embodiments, a SYNC signal is used to select an interface mode. According to one or more embodiments, the interface mode is determined from whether or not a clock signal is detected, as will be described in greater detail below.

The ALE signal line 734 is connected to input buffer 760. The output of buffer 760 is connected to the input (D) of clocked D flip-flop 762, e.g., latch 762. The non-inverted output (Q) of latch 762, indicating the latched ALE signal ale_1 is coupled as a first input 763 to command decoder 764. The CLE signal line 732 is connected to input buffer 766. The output of buffer 766 is connected to the input (D) of clocked D flip-flop 768, e.g., latch 768. The non-inverted output (Q) of latch 768, indicating the latched CLE signal cle_1 is coupled as a second input 769 to command decoder 764. The WE# signal line 736 is connected to input buffer 770. The output of buffer 770 is not latched, having signal we_clk, and is coupled as a third input 771 to command decoder 764.

The RE# signal line 738 is connected to input buffer 772. The output of buffer 772 is connected to the input (D) of clocked D flip-flop 774, e.g., latch 774. The non-inverted output (Q) of latch 774, indicating the latched input signal, e.g., wr_1, is coupled as a fourth input 775 to command decoder 764. The (unlatched) we_clk signal line 771, from the output of buffer 770, is connected as a clock input to latches 762, 768, 774, as well as latch 779 (discussed below).

As one skilled in the art will appreciate, command decoder 764 is programmed to decode the signals on its inputs, to determine the logical state on each of two output signal lines, command clock (cmdclk) signal line 778, and address clock (adrclk) signal line 780. Command clock (cmdclk) signal line 778 is connected to the clock input of command latch 782, and address clock (adrclk) signal line 780 is connected to the clock input of address latch 784.

The bus I/O signal lines 726, e.g., [7:0], are connected to input buffer 771, an N-bit, e.g., 8-bit, wide buffer. The output of buffer 771 is connected in parallel to the corresponding bit input (D) of three N-bit, e.g., 8-bit, clocked D flip-flops, e.g., latch 779, latch 781 and latch 783. The non-inverted output (Q) of latch 779, indicating the latched N-bit, e.g., 8-bit, command/address/data signal information is connected as a first input to multiplexer 785 and as an input to both an N-bit, e.g., 8-bit, clocked D command flip-flop, e.g., command latch 782, and an N-bit, e.g., 8-bit, clocked D address flip-flop, e.g., address latch 784. The output of command latch 782 is an N-bit, e.g., 8-bit, command signal line 786, and the output of address latch 784 is an N-bit, e.g., 8-bit, address signal line 788. The output of latch 781 is connected as a second input to multiplexer 785. The output of multiplexer 785 is the data_r signal line 790.

Latch 783 is clocked by an inverted data strobe signal, the output of input buffer 761 being connected (inverted) to the clock input of latch 783. The output of latch 783 is the data_f [7:0] signal line 791.

The memory interface mode selection signal SYNC is connected to the command decoder 764 as a fifth input 776. This control signal (SYNC) is active when in a HIGH logic state, and defines which memory interface mode is selected, according to one or more embodiments of the present disclosure. In addition to being an input to the command decoder 764, the SYNC signal line 776 is also connected to multiplexer 785, and the output enable logic 787 to configure these logic elements for the selected memory interface mode.

When the asynchronous mode is selected, multiplexer 785 selects the data input register clocked by the WE# signal, e.g., latch 779. The command decoder 764 will ignore the signal on the wr_1 input 775 (derived from the RE# signal line 738). The output enable logic 787 will produce an output enable signal (oe_) triggered from the falling edge of the signal derived from the RE# signal line 738, e.g., the re_wr signal 765 on the output of the input buffer 772.

The outputs of latch 762 (ale_1), latch 768 (cle_1), latch 774 (wr_1), and buffer 770 (we_clk) are all connected as inputs to the output enable logic 787. The output of output enable logic 787, shown as indicating the oe_ signal, is connected as a control input to I/O output buffer 773 and data strobe (DQS) output buffer 767. The input to I/O output buffer 773 is the dout [7:0] N-bit, e.g., 8-bit, signal line 789. The input to DQS output buffer 767 is the dqs_clk signal line 792.

When the synchronous mode is selected, e.g., by the state of the signal on the SYNC signal line 776, multiplexer 785 will select the data input register clocked by the DQS, e.g., from latch 781. The command decoder 764 will utilize the signal on the wr_1 input 775 in its logic (derived from W/R# input signal line 738 in synchronous mode—corresponding to the RE# signal line 738 in asynchronous mode).

The output enable logic 787 will utilize the signals derived from the ALE, CLE, W/R#, and CLK input signal lines (e.g., ale_1 763, cle_1 769, wr_1 775, and we_clk 771 signal lines respectively. As the reader will appreciate, the output enable logic controls the direction of the I/O (data) and DQS (data strobe) signals by enabling the corresponding output buffers, e.g., 773 and 767, the respective outputs being connected to I/O line 726 and DQS signal line 728 respectively.

The dual, e.g., asynchronous/synchronous, interface system has been developed to provide, for example, a backwards-compatible asynchronous interface to legacy memory devices, as well as to provide a synchronous interface for higher-speed synchronous memory devices. When operating in synchronous mode, the dual interface is driven from the source of the data, e.g., DQS is driven from the data source. Thus, the bidirectional I/O DQS pin 728 is added to the interface for this purpose. For reads from memory, e.g., NAND Flash memory, the memory device drives the DQS signal on the DQS pin 728 with the output data. DQS is edge aligned with the data. For writes to memory, e.g., NAND Flash memory, a host drives the DQS signal on the DQS pin 728 with the input data, and the DQS signal is center aligned with the data.

According to one or more embodiments, the dual interface defaults to be initially configured, e.g., powered-up, in the asynchronous mode so as to be backwards-compatible with legacy, e.g., asynchronous, memory devices. However, the mode of the interface may be changed, for example using the Set Feature command, by detection of a clock signal, or by hard programming such as fuse or metal options. When the interface is changed from asynchronous mode, to the synchronous mode, the signal on the Write Enable (WE#) signal line is redefined as communicating a clock (CLK) signal, thus in the synchronous mode the WE# signal line becomes a CLK signal line. Also, the signal on the Read Enable (RE#) signal line is redefined as communicating a Write/Read (W/R#) signal, thus in the synchronous mode the RE# signal line becomes a W/R# signal line.

In addition, the DQS signal line is enabled. When the interface is changed from a synchronous mode, to the asynchronous mode, the signal on the clock (CLK) signal line is redefined as communicating a Write Enable (WE#) signal, thus in the asynchronous mode the CLK signal line becomes WE# signal line. Also, the signal on the Write/Read (W/R#) signal line is redefined as communicating a Read Enable (RE#) signal, thus in the asynchronous mode the W/R# signal line becomes a RE# signal line. The DQS signal is also not used, e.g., disabled, in the asynchronous mode.

As one skilled in the art will appreciate, in accordance with one or more of the presently disclosed embodiments, only one new contact, e.g., for the data strobe (DQS) signal, needs to be added to the interface to support the synchronous mode in addition to the contacts used to support the asynchronous mode (excluding the additional signal lines for optional complementary signals associated with DDR communications). Thus, memory devices, e.g., NAND devices, utilizing the memory interface, according to embodiments of the present disclosure, can be plugged into sockets of existing technologies, e.g., dedicated asynchronous communications, to take advantage of the backward compatibility features, and plugged into sockets of synchronous-capable systems to take advantage of the faster performance features.

As described above, either an asynchronous mode or a synchronous mode is selected by the circuit illustrated in FIG. 7 based on the status of a SYNC signal, e.g., logic state present on the SYNC signal line 776. The SYNC signal line 776 may be coupled to a register, for example, such that the SYNC signal represents the logic status of a bit in command register 424 shown in FIG. 4. However, embodiments of the present disclosure are not so limited to such a "master signal" configuration for selecting the mode of the interface to be either asynchronous or synchronous.

According to one or more embodiments of the present disclosure, selection of the asynchronous mode, or synchronous mode, may be made by a clock signal auto-detection circuit. As will be appreciated by one skilled in the art, a free-running clock signal changes between logic states according to a time period. A clock signal is used to coordinate synchronous communications between a source and destination; however, asynchronous communications occur without correspondence to a clock signal. The clock auto-detection circuit is configured to sense the presence or absence of a free-running clock signal, e.g., on the WE#/Clk signal line 736. Thus, the detection of a free-running, e.g., continuous, periodic clock signal on the WE#/Clk signal line 736, can be used to determine that the memory interface may operate in a synchronous mode.

Thus, a clock auto-detection circuit may be configured to monitor the WE#/Clk signal line 736, e.g., when the chip to be monitored is enabled, for the presence (or absence) of a periodic signal, corresponding to a predetermined clock frequency, existing for a particular amount of time, or number of clock cycles. The clock auto-detection circuit can, for example, generate the SYNC output corresponding to selecting the synchronous mode when clock signal detection criteria are satisfied, and otherwise generating the SYNC output corresponding to selecting the asynchronous mode, e.g., when clock signal detection criteria are not satisfied. Clock signal detection criteria may include, for example, a clock signal being present for a certain number of cycles, or for a certain period of time.

According to one or more embodiments, the memory interface has a first mode in which data transfer circuits of a memory device are not driven by an internal clock signal. The memory interface also has a second mode in which data transfer circuits of a memory device are driven by an internal clock signal. For example, a memory interface powers-up in a default asynchronous mode. If no free-running clock signal is detected on the WE#/Clk signal line 736, the SYNC signal is set to one state corresponding to the memory interface continuing to operate in the default asynchronous mode. However, if a free-running clock signal is detected on the WE#/Clk signal line 736, the SYNC signal is then set to another state corresponding to the memory interface switching to operate in a synchronous mode.

According to one or more embodiments, detection for a free-running clock signal occurs once the chip is enabled, e.g., the CE# signal goes to an active state. According to one or more embodiments, the memory interface defaults to operate in a synchronous mode, with detection for absence of a free-running clock signal causing the memory interface to switch to an asynchronous mode.

Figure 8:
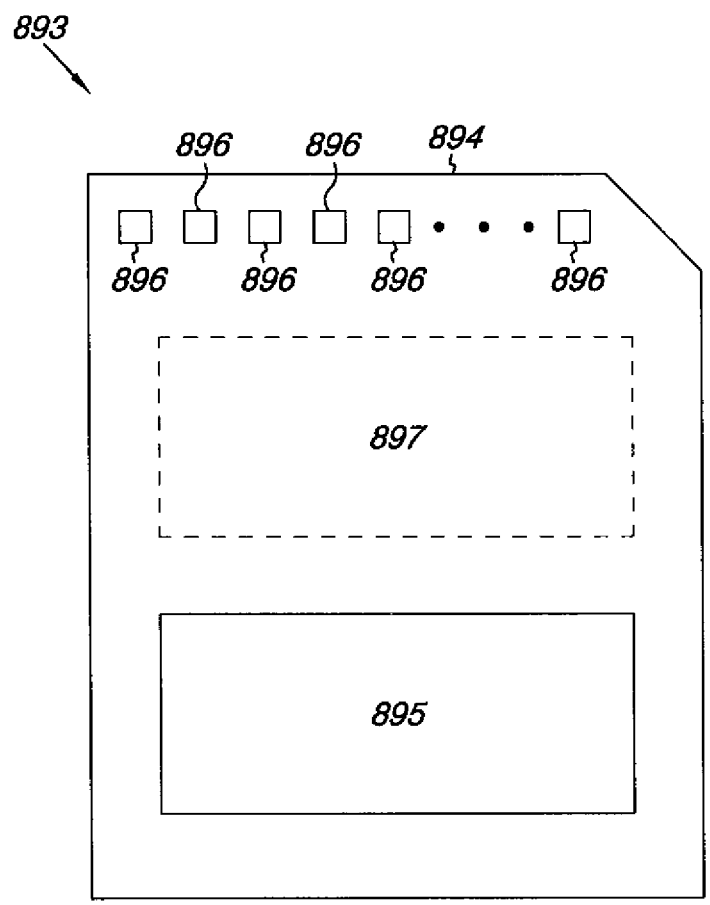
FIG. 8 is a functional block diagram of a memory module having at least one memory device, in accordance with one or more embodiments of the present disclosure.

FIG. 8 is a circuit diagram of a memory interface circuit, in accordance with one or more embodiments of the present disclosure. FIG. 8 is a functional block diagram of a memory module having at least one memory device operated in accordance with one or more embodiments of the present disclosure. Memory module 893 is illustrated as a memory card, although the concepts discussed with reference to memory module 893 are applicable to other types of removable or portable memory (e.g., USB flash drives) and are intended to be within the scope of "memory module" as used herein. In addition, although one example form factor is depicted in FIG. 8, these concepts are applicable to other form factors as well.

In one or more embodiments, memory module 893 will include a housing 894 (as depicted) to enclose one or more memory devices 895, though such a housing is not essential to all devices or device applications. At least one memory device 895 includes an array of non-volatile multilevel memory cells that can be sensed according to embodiments described herein. Where present, the housing 894 includes one or more contacts 896 for communication with a host device. Examples of host devices include digital cameras, digital recording and playback devices, PDAs, personal computers, memory card readers, interface hubs and the like. For one or more embodiments, the contacts 896 are in the form of a standardized interface. For example, with a USB flash drive, the contacts 896 might be in the form of a USB Type-A male connector. For one or more embodiments, the contacts 896 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 896 provide an interface for passing control, address and/or data signals between the memory module 893 and a host having compatible receptors for the contacts 896.

The memory module 893 may optionally include additional circuitry 897, which may be one or more integrated circuits and/or discrete components. For one or more embodiments, the additional circuitry 897 may include control circuitry, such as a memory controller, for controlling access across multiple memory devices 895 and/or for providing a translation layer between an external host and a memory device 895. For example, there may not be a one-to-one correspondence between the number of contacts 896 and a number of 895 connections to the one or more memory devices 895. Thus, a memory controller could selectively couple an I/O connection (not shown in FIG. 8) of a memory device 895 to receive the appropriate signal at the appropriate I/O connection at the appropriate time or to provide the appropriate signal at the appropriate contact 896 at the appropriate time. Similarly, the communication protocol between a host and the memory module 893 may be different than what is required for access of a memory device 895. A memory controller could then translate the command sequences received from a host into the appropriate command sequences to achieve the desired access to the memory device 895. Such translation may further include changes in signal voltage levels in addition to command sequences.

The additional circuitry 897 may further include functionality unrelated to control of a memory device 895 such as logic functions as might be performed by an ASIC. Also, the additional circuitry 897 may include circuitry to restrict read or write access to the memory module 893, such as password protection, biometrics or the like. The additional circuitry 897 may include circuitry to indicate a status of the memory module 893. For example, the additional circuitry 897 may include functionality to determine whether power is being supplied to the memory module 893 and whether the memory module 893 is currently being accessed, and to display an indication of its status, such as a solid light while powered and a flashing light while being accessed. The additional circuitry 897 may further include passive devices, such as decoupling capacitors to help regulate power requirements within the memory module 893.

CONCLUSION

The present disclosure includes methods, and circuits, for operating a memory device. One method embodiment includes controlling data transfer through a memory interface in an asynchronous mode by writing data to the memory device at least partially in response to a write enable signal on a first interface contact, and reading data from the memory device at least partially in response to a read enable signal on a second interface contact. The method further includes controlling data transfer in a synchronous mode by transferring data at least partially in response to a clock signal on the first interface contact, and providing a bidirectional data strobe signal on an interface contact not utilized in the asynchronous mode.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising: powering-up the memory device in an asynchronous operating mode;
   detecting for a clock signal on a write enable signal line of the powered-up memory device;
   switching the powered-up memory device to a synchronous operating mode at least partially in response to detecting a clock signal on the write enable signal line; and
   transferring data to the memory device in a synchronous manner utilizing a signal on only one more contact of the memory device than the quantity of contacts of the memory device utilized in the asynchronous operating mode.

2. The method of claim 1, including detecting for the clock signal at least partially in response to a chip enable signal.

3. The method of claim 1, further comprising transferring data to the memory device in a synchronous manner at least partially in response to the clock signal.

4. The method of claim 1, including synchronizing data transfer to state transitions of a bidirectional data strobe signal in the synchronous mode.

5. A method for operating a memory device, comprising: powering-up the memory device in an asynchronous operating mode;
   detecting for a clock signal on a write enable signal line of the powered-up memory device;
   switching the powered-up memory device to a synchronous operating mode if a clock signal is detected on the write enable signal line;
   and transferring data to the memory device in a synchronous manner utilizing a signal on only one more memory device contact than the quantity of contacts utilized in the asynchronous operating mode.

6. The method of claim 5, wherein a bidirectional data strobe signal is the signal on the only one more memory interface contact.

7. The method of claim 6, wherein a state of a signal line used to enable reading in the asynchronous operating mode controls direction of data and the bidirectional data strobe signal.

8. A method of operating a memory interface, comprising: powering-up the memory interface in an asynchronous operating mode;
   providing a write enable signal on a write enable signal line of the powered-up memory interface;
   switching the powered-up memory interface to a synchronous operating mode at least partially in response to detecting a clock signal on the write enable signal line; and
   transferring data to the memory interface in a synchronous manner utilizing a signal on only one more contact of the more memory interface than the quantity of contacts of the memory interface utilized in the asynchronous operating mode.

9. A method of operating a memory interface, comprising: powering-up the memory interface in an asynchronous operating mode;
   providing a write enable signal on a write enable signal line of the powered-up memory interface in the asynchronous operating mode;
   operating the memory interface in the asynchronous mode until a clock signal is detected on the write enable signal line;
   switching the memory interface to a synchronous operating mode if the clock signal is detected on the write enable signal line;
   controlling data transfer responsive to the bidirectional data strobe signal line in the synchronous mode; and
   disabling the bidirectional data strobe signal line in the asynchronous mode.

10. The method of claim 8, including detecting for the clock signal on the write enable signal line at least partially in response to a chip enable signal on a chip enable signal line.

11. A method of operating a memory interface, comprising:
    powering-up the memory interface in an asynchronous operating mode;
    providing a write enable signal on a write enable signal line of the powered-up memory interface in the asynchronous operating mode;
    operating the memory interface in the asynchronous mode until a clock signal is detected on the write enable signal line;
    operating the memory interface in the synchronous mode while the clock signal is present on the write enable signal line;
    providing a read enable signal on a read enable signal line in the asynchronous operating mode; and
    providing a write/read signal on the read enable signal line in the synchronous operating mode.

12. The method of claim 8, including switching the memory interface to a synchronous operating mode responsive to a GET feature command.

13. A memory interface, comprising:
    a bi-directional multiplexed bus for communicating command, address, and data information; and
    control circuitry to control the command, address, and data information on portions of the bus, and provide a second signal on a second signal line, responsive to at least a first signal on a first signal line,
    wherein the memory interface is powered-up in an asynchronous operating mode, and
    wherein the control circuitry utilizes the first signal as a write enable signal in an asynchronous mode and as a clock signal in a synchronous mode,
    and wherein the control circuitry switches to a synchronous operating mode at least partially in response to detecting the clock signal on the first signal line; and
    wherein transferring data to the memory interface in a synchronous manner requires only one more contact on the more memory interface than the quantity of contacts on the memory interface required in the asynchronous operating mode.

14. The memory interface of claim 13, wherein the control circuitry processes the second signal as a read enable signal in the asynchronous mode and as a write/read signal in the synchronous mode.

15. The memory interface of claim 13, wherein the control circuitry detects for the clock signal at least partially in response to a chip enable signal.

16. The memory interface of claim 13, wherein the control circuitry synchronizes data transfer to state transitions of a bidirectional data strobe signal in the synchronous mode.

17. A memory interface, comprising:
- a bi-directional multiplexed bus for communicating command, address, and data information; and
- control circuitry to control the command, address, and data information on portions of the bus, and provide a second signal on a second signal line, responsive to at least a first signal on a first signal line,
- wherein the memory interface is powered-up in an asynchronous operating mode, and
- wherein the control circuitry utilizes the first signal as a write enable signal in an asynchronous mode and as a clock signal in a synchronous mode, and
- wherein the control circuitry switches to a synchronous operating mode if the clock signal is detected on the first signal line, and
- wherein the control circuitry transfers data to the memory device in a synchronous manner utilizing a signal on only one more memory interface contact than a quantity of contacts utilized in the asynchronous operating mode.

18. The memory interface of claim 17, wherein the signal on the only one more memory interface contact is a bidirectional data strobe signal.

19. The memory interface of claim 18, wherein the control circuitry uses a state of a signal line used to enable reading in the asynchronous operating mode to control direction of data and the bidirectional data strobe signal.

* * * * *